United States Patent
Chebiam et al.

(10) Patent No.: US 7,470,617 B2
(45) Date of Patent: Dec. 30, 2008

(54) TREATING A LINER LAYER TO REDUCE SURFACE OXIDES

(75) Inventors: Ramanan Chebiam, Hillsboro, OR (US); Chin-Chang Cheng, Portland, OR (US); Damian Whitney, Hillsboro, OR (US); Harsono Simka, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/712,674

(22) Filed: Mar. 1, 2007

(65) Prior Publication Data
US 2008/0213994 A1  Sep. 4, 2008

(51) Int. Cl.
*H01L 21/44* (2006.01)
(52) U.S. Cl. ............ 438/643; 438/644; 438/650; 257/E21.174; 257/E21.586
(58) Field of Classification Search .......... 438/643, 438/686, 650, 678, 644, 622
See application file for complete search history.

(56) References Cited
U.S. PATENT DOCUMENTS
2005/0009325 A1* 1/2005 Chung et al. ............ 438/637
2006/0246699 A1* 11/2006 Weidman et al. ......... 438/597
2007/0004587 A1   1/2007 Chebiam et al. ......... 502/167
2007/0099422 A1* 5/2007 Wijekoon et al. ........ 438/687

OTHER PUBLICATIONS

U.S. Appl. No. 11/639,636, filed Dec. 14, 2006, entitled "Improving Copper Nucleation In Interconnects Having Ruthenium Layers," by Ramanan V. Chebiam and Valery M. Dubin.
U.S. Appl. No. 11/591,792, filed Nov. 1, 2006, entitled "Deposition Process For Iodine-Doped Ruthenium Barrier Layers," by Joseph H. Han, et al.

* cited by examiner

*Primary Examiner*—W. David Coleman
*Assistant Examiner*—Shaka Scarlett
(74) *Attorney, Agent, or Firm*—Trop, Pruner & Hu, P.C.

(57) ABSTRACT

In one embodiment, the present invention includes a method for depositing a barrier layer on a substrate having a trench, depositing a liner layer on the barrier layer that includes a surface oxide, electrolessly depositing a copper seed layer on the liner layer, where the surface oxide is reduced in-situ in an electroless bath, depositing a bulk metal layer on the copper seed layer. Other embodiments are described and claimed.

13 Claims, 2 Drawing Sheets

TREATING A LINER LAYER TO REDUCE SURFACE OXIDES

BACKGROUND

In the manufacture of integrated circuits, interconnects can be formed on a semiconductor substrate, often using a dual damascene process. Such a process begins with a trench formed in a dielectric layer over which various layers such as an adhesive layer, a barrier layer, and other layers such as a seed layer may be subsequently formed. The adhesion layer is used because the subsequently deposited metals do not readily nucleate on barriers. The barrier layer prevents a copper (Cu) layer from diffusing into the underlying dielectric layer. This may be followed by an electroplating (EP) process used to deposit a bulk copper layer to fill the trench and form the interconnect.

Some manufacturing technologies use a physical vapor deposition (PVD) process to form barrier and Cu seed layers followed by EP Cu layer. As features continue to shrink, limited extendibility of a PVD seed layer may occur due to its non-conformal characteristics, which cause large overhang and incomplete sidewall coverage. Overhang decreases entrance opening and increases effective aspect ratio beyond the filling capabilities of current EP gapfill technology. Thus options for conformal, platable, barrier or liner layers are being pursued. Although barrier/liner layers do not typically have a passivation oxide layer, surface oxides are still present, preventing void-free Cu EP due to poor Cu nucleation. Thus, direct EP or electroless (EL) deposition of copper on a liner layer is difficult, due to presence of stable oxides, leading to poor nucleation and three dimensional (3D) rough microstructure, and EP voids within features.

DETAILED DESCRIPTION

In various embodiments, a surface treatment for an adhesion or liner layer may be provided to remove a surface oxide prior to a thin film deposition process. In some embodiments, the liner may be a semi-noble liner layer and the surface treatment may use wet chemistry to remove the surface oxide. In this way, subsequent heterogeneous nucleation of a conductive material that is deposited via an electroless (EL) plating or electrodeposition (EP) process on a liner layer such as ruthenium or iridium can be performed. In other embodiments, the treatment process can be performed using a common bath to simultaneously pre-treat and plate a seed layer.

Figure 1:
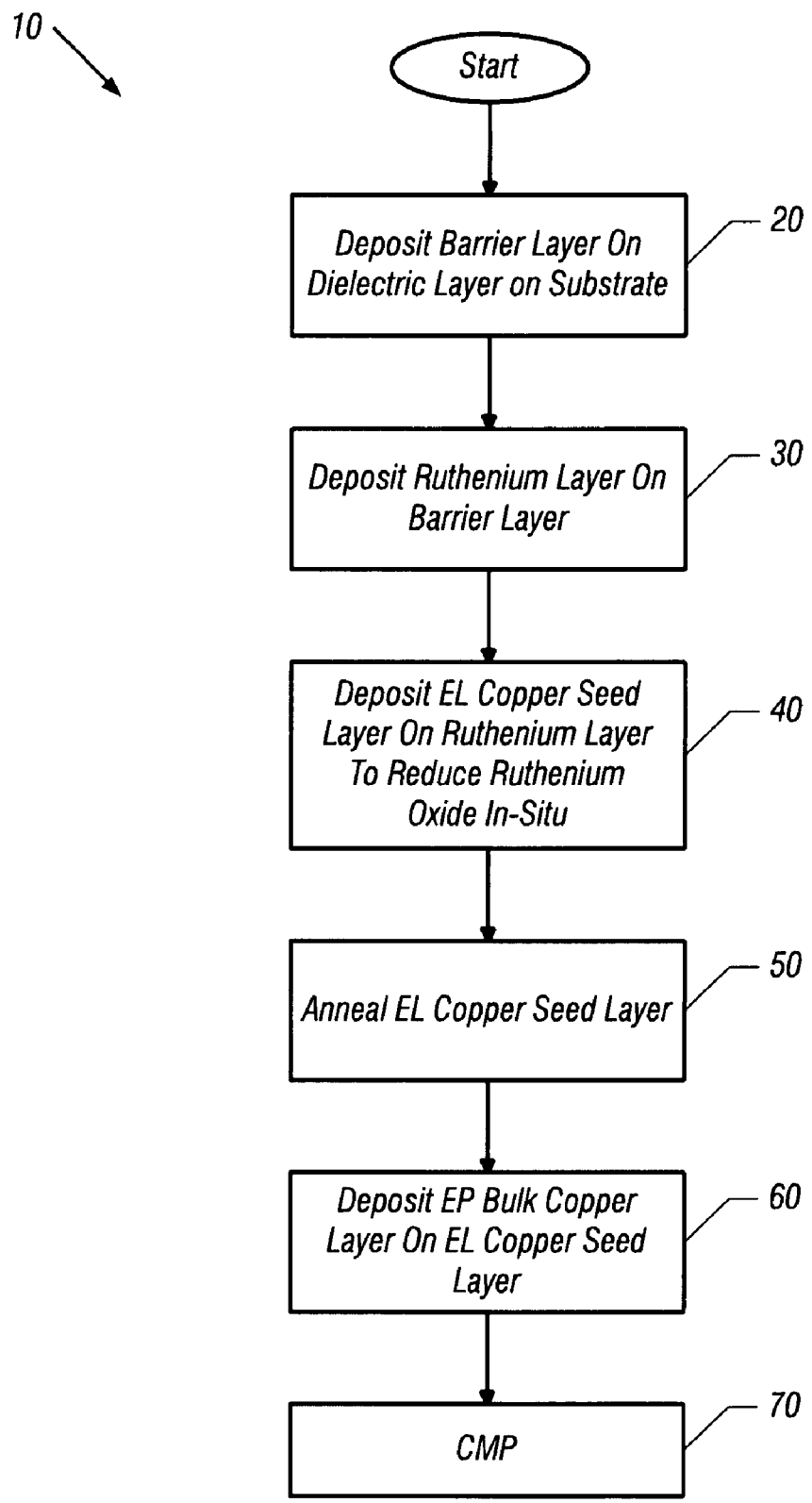
FIG. 1 is a process for fabricating a metal interconnect, such as a copper interconnect, in accordance with an embodiment of the present invention.

Referring now to FIG. 1, shown is a flow diagram of a process in accordance with an embodiment of the present invention. A substrate may be provided on which at least one dielectric layer is formed. The dielectric layer may be formed using materials known for their applicability in dielectric layers for integrated circuit structures, such as low-k dielectric materials. Such dielectric materials include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer may include pores or other voids to further reduce its dielectric constant. The dielectric layer may include one or more openings (e.g., trenches and/or vias) within which a metal interconnect will be formed. The trenches and/or vias may be patterned using conventional wet or dry etch techniques that are known in the art.

The substrate may be housed in a reactor in preparation for a deposition process. In various implementations, the substrate may be heated within the reactor to a temperature between around 50° Celsius (C.) and around 400° C. The pressure within the reactor may range from 0.05 Torr to 3.0 Torr.

A barrier layer is then deposited on the dielectric layer and within the trench (block 20). The barrier layer may be formed from a material that will substantially inhibit metal from diffusing into the underlying dielectric layer. For instance, if the subsequently formed metal interconnect is a copper interconnect, the barrier layer inhibits copper metal from diffusing into the dielectric layer. In some implementations of the invention, the barrier layer may be formed from tantalum nitride (TaN). In other implementations of the invention, alternate materials may be used such as titanium nitride (TiN), other metal nitrides, or other metals, including but not limited to tantalum, tungsten, tungsten carbide, tungsten nitride, tantalum silicon nitride, titanium silicon nitride, ruthenium tantalum, tungsten silicon nitride, ruthenium, and their alloys. The barrier layer may be formed using a deposition process, including but not limited to a physical vapor deposition (PVD) process such as a sputtering process, a chemical vapor deposition (CVD) process, an atomic layer deposition (ALD) process, or a derivative of one of these processes. The barrier layer may be around 3 Angstroms (Å) to 20 nanometers (nm) thick, although it is generally around 10 nm thick.

Next, a ruthenium layer is formed atop the barrier layer (block 30). The ruthenium layer is a low resistive layer (relative to most barrier layers) that provides adhesion layer functionality. In other words, the ruthenium layer acts as a liner layer and provides a surface upon which metal may nucleate, thereby enabling a metal such as copper to become deposited over the barrier layer. In some implementations, the ruthenium layer may be formed using a deposition process such as PVD, CVD, ALD, electroless plating (EL), or electroplating (EP). In some implementations, a metal immobilization process (MIP) may be used to form the ruthenium layer. In various implementations, the ruthenium layer may range from 1 nm to 20 nm in thickness.

As described above, nucleation issues may arise when a metal such as a copper is electroplated directly onto an oxide-covered ruthenium layer. Such issues may lead to void formation at the copper-ruthenium interface. Accordingly, in various embodiments a surface treatment by in-situ chemical means may be applied to reduce surface oxides in the ruthenium layer prior to conductive material deposition. As shown in FIG. 1, this in-situ treatment may be performed simultaneously with EL seed layer plating (block 40). Alternately, a separate pre-treatment step can be performed, followed by an EL seed deposition (if required) and then bulk metal may be deposited directly on the liner layer, in other embodiments.

The aqueous chemistry used for a pre-treatment process may be an alkaline chemistry including surface active species that can provide electrons to reduce a surface oxide to its metallic state. The alkaline chemistry may have wide operating temperatures (e.g., 25 to 80 C.). The surface active chemical species may include one or more of: glyoxylic acid, formaldehyde, hypophosphite, hydrazine, dimethyl-amine borane complex, trimethylamine borane, N-methylmorpholine borane and Na borohydride. Such chemical species may thus be catalytically oxidized by the liner layer. Furthermore, the chemistry may include a wetting surfactant to improve surface wetting and reduce affinity of hydrogen and nitrogen gaseous byproducts of oxidation reactions. Such additives may act as oxygen-hydrogen scavengers to reduce unwanted oxygen and hydrogen concentrations. Using such chemical species, heterogeneous copper nucleation may be improved on similar metals. Still further, copper two-dimensional nucleation may be induced rather than the undesired, uncontrollable three-dimensional growth. In various embodiments, instead of ruthenium the layer to be treated with the chemistry may include rhodium (Rh), rhenium (Re), iridium (Ir), osmium (Os), molybdenum (Mo), vanadium (V), and copper (Cu), and their alloys, any of which may be used as part of the interconnects in semiconductor devices.

In one embodiment, using various reducing agents, a ruthenium oxide ($RuO_2$) surface may be reduced to metallic ruthenium. For example, reduction of $RuO_2$ by glyocylic acid may be performed in accordance with the following equation:

$$RuO_2(s) + 2CHO\text{---}COOH \rightarrow Ru(s) + 2(COOH)_2$$

Note that after such surface treatment, an optional gas phase treatment may be performed such as performing a gas anneal to remove residual organic contaminants from the treatment process. After such treatment, a wafer may be immediately subjected to a conductive material deposition process, such as copper plating such as an electroplating process to form both seed and bulk portions of a copper-layer, or an electroless deposit of a seed layer followed by an electroplating process to deposit a bulk layer. Such processes may be followed by chemical mechanical polishing (CMP) to form desired interconnects in a semiconductor device. In various implementations, the EL copper seed layer may range from 1 nm to 50 nm in thickness.

Referring back to FIG. 1, in many implementations a surface pre-treatment may be combined with an electroless plating of a seed layer. In this way, time and expense may be reduced as the pre-treatment and EL deposition may occur in a single bath. Accordingly, as shown at block 40, an EL copper seed layer may be deposited on a ruthenium layer to reduce ruthenium oxide in-situ. In this combined process, a single bath may be used. An EL plating process is a metal deposition process in which the metal begins in solution and a controlled chemical reduction reaction is used to deposit the metal onto a substrate. The electroless process is autocatalytic as the metal being deposited catalyzes the chemical reduction reaction without the need for an external electric current. Electroless plating is a selective deposition and occurs at activated locations on the substrate surface, i.e., locations that have a nucleation potential for an electroless plating solution. Because of the alkaline nature of the bath, the surface oxide, which is unstable in an alkaline solution, may first be removed and then an EL seed layer may deposit. Note that when placed in the EL bath, a surface oxide layer of between approximately 1 and 100 Å may be present. The EL process may be performed for varying amounts of time, in some embodiments the time may range between 5 seconds and 600 seconds. During this time, first the surface oxide may be removed and then the seed layer may deposit.

By depositing a conformal EL seed layer, gap fill may be performed using a conventional EP process. Further, because the EP process interacts with a Cu seed layer, no changing of organic additives to an EP bath may be needed. Furthermore, providing an EL seed layer may reduce across the wafer resistance to improve uniformity post electroplating. In one embodiment, an electroless Cu bath for use both as pretreatment and for EL deposition is as follows:

Cu(2+): 0.5-50 grams/liter
Bipyridyl: 0.05-1.5 grams/liter
EDTA: 0-60 grams/liter
Glyoxylic acid: 0.5-6 grams/liter
PEG: 0-5 grams/liter
RE610: 0-1 grams/liter
TritonX100: 0-5 grams/liter
pH: 10-13.5
Temperature: 55-80° C.

Still referring to FIG. 1, in some implementations an annealing process may be carried out to modify the EL copper seed layer (block 50). The annealing process may take place at a temperature that ranges from around 100° C. to 400° C. for a time period that ranges from 10 seconds to 1 hour. The annealing process causes larger grains to form in the EL copper seed layer.

Next, a bulk metal layer is deposited atop the EL copper seed layer to fill the trench with metal and form the metal interconnect (block 60). In most implementations, the bulk metal layer is formed of copper metal or a copper alloy. In alternate implementations, other metals may be used. The bulk metal layer is deposited using an EP process. In an electroplating process, a metal layer is deposited on a semiconductor substrate by applying a voltage bias on the substrate and immersing it into an electrolyte solution that contains a salt of the metal to be deposited. The electrolyte solution is referred to as a plating bath or an electroplating bath. The metallic ions of the salt carry a positive charge and are attracted to the substrate. When the ions reach the substrate, the negatively charged substrate provides the electrons to "reduce" the positively charged ions to metallic form, thereby causing the metal to deposit on the substrate. The EL copper seed layer provides an area of attachment for the metal ions.

Finally, a chemical mechanical polishing (CMP) process may be used to planarize the deposited layers and remove any excess metal to complete fabrication of the metal interconnect (block 70). The CMP process removes portions of the bulk copper layer, the EL copper seed layer, the ruthenium layer, and the barrier layer that are situated outside of the trench. CMP generally involves the use of a rotating polishing pad and an abrasive, corrosive slurry on a semiconductor wafer. After the copper metal is deposited on the surface of a semiconductor wafer, the polishing pad and the slurry grind flat the microscopic topographic features until the metal is planarized, thereby allowing subsequent processes to begin on a flat surface. CMP slurries used for copper typically contain abrasive particles such as silicon dioxide ($SiO_2$), aluminum oxide ($Al_2O_3$), or cerium oxide ($CeO_2$). CMP slurries for copper also tend to include an oxidizer species such as hydrogen peroxide ($H_2O_2$), organic complexing agents, surfactants with both hydrophobic and hydrophilic chemical groups, and/or corrosion inhibitors such as benzotriazole.

Figure 2:
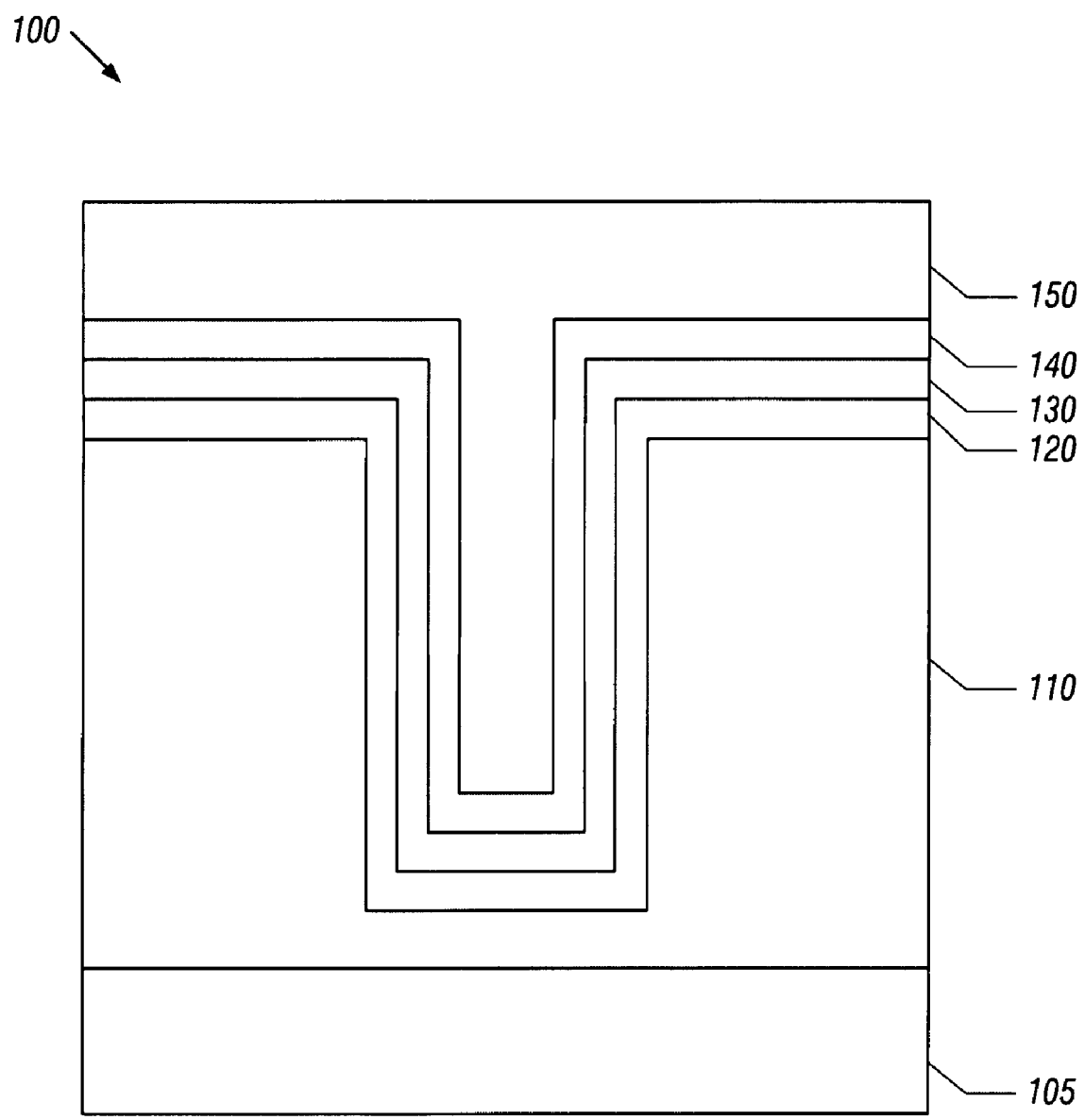
FIG. 2 is a cross section of a wafer in accordance with an embodiment of the present invention.

Referring now to FIG. 2, shown is a cross section of a semiconductor wafer in accordance with an embodiment of the present invention. As shown in FIG. 2, wafer 100 includes a substrate 105 having a dielectric layer 110 formed thereon. Note while shown for ease of illustration in FIG. 2 as being formed directly on substrate 105, one or many additional layers including desired patterning forming microelectronic devices may be present between substrate 105 and dielectric layer 110.

Still referring to FIG. 2, dielectric layer 110 is patterned to provide an opening. Next, a barrier layer 120 is formed. In one embodiment, barrier layer 120 may be a tantalum nitride (TaN). Then a liner layer 130, which may be ruthenium, is next deposited. Then, an EL process in accordance with an embodiment of the present invention may be performed to both pre-treat liner layer 130 by removal of a surface oxide therefrom, as well as to form an EL seed layer 140, which may be a Cu seed layer. Then a conductive layer 150 may be formed on seed layer 140. For example, in many implementations a Cu layer may be formed by EP. Of course, additional processing may be performed, such as a CMP process for removal of one or more of the layers from certain portions of the wafer and so forth.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    depositing a barrier layer on a substrate having a trench;
    depositing a liner layer on the barrier layer, wherein the deposited liner layer includes a surface oxide;
    electrolessly depositing a copper seed layer on the liner layer, wherein the surface oxide is reduced in-situ in an electroless bath; and
    using an electroplating process to deposit a bulk metal layer on the copper seed layer.

2. The method of claim 1, wherein the liner layer comprises ruthenium and the surface oxide comprises ruthenium oxide.

3. The method of claim 1, wherein the barrier layer comprises at least one of tantalum nitride and titanium nitride.

4. The method of claim 1, wherein the ruthenium layer is deposited using one of a physical vapor deposition process, a chemical vapor deposition process, or an atomic layer deposition process.

5. The method of claim 1, further comprising annealing the copper seed layer prior to using the electroplating process to deposit the bulk metal layer.

6. The method of claim 1, wherein the electroless bath includes a wetting surfactant.

7. The method of claim 6, wherein the electroless bath includes at least one scavenger to reduce oxygen or hydrogen concentration.

8. The method of claim 1, further comprising planarizing the deposited layers to complete fabrication of a metal interconnect.

9. The method of claim 1, wherein the bulk metal layer comprises copper or a copper rich alloy.

10. A method comprising:
    depositing a liner layer wherein the deposited liner layer includes a surface oxide;
    reducing the surface oxide in situ in an electroless bath; and
    depositing a copper seed layer on said liner layer in said electroless bath.

11. The method of claim 10 including depositing a barrier layer on a substrate having a trench before depositing said liner layer.

12. The method of claim 11 including depositing a bulk metal layer on said copper seed layer.

13. The method of claim 10 wherein depositing a liner layer includes depositing ruthenium.

* * * * *